United States Patent
Dhindsa

(10) Patent No.: US 8,449,679 B2
(45) Date of Patent: May 28, 2013

(54) TEMPERATURE CONTROLLED HOT EDGE RING ASSEMBLY

(75) Inventor: Rajinder Dhindsa, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 1321 days.

(21) Appl. No.: 12/222,789

(22) Filed: Aug. 15, 2008

(65) Prior Publication Data

US 2010/0040768 A1  Feb. 18, 2010

(51) Int. Cl.
*H05H 1/00* (2006.01)
(52) U.S. Cl.
USPC ............... 118/728; 118/723 E; 156/345.51; 156/345.47
(58) Field of Classification Search
USPC .......... 118/728, 723 E; 156/345.51, 345.47
See application file for complete search history.

(56) References Cited

U.S. PATENT DOCUMENTS

| | | | |
|---|---|---|---|
| 4,654,754 A | 3/1987 | Daszkowski | |
| 4,782,893 A | 11/1988 | Thomas | |
| 5,476,548 A | 12/1995 | Lei et al. | |
| 5,518,758 A | 5/1996 | Tiburtius et al. | |
| 5,534,751 A | 7/1996 | Lenz et al. | |
| 5,545,473 A | 8/1996 | Ameen et al. | |
| 5,569,356 A * | 10/1996 | Lenz et al. | 438/729 |
| 5,660,917 A | 8/1997 | Fujimori et al. | |
| 5,679,457 A | 10/1997 | Bergerson | |
| 5,781,412 A | 7/1998 | de Sorgo | |
| 5,805,408 A | 9/1998 | Maraschin et al. | |
| 5,978,202 A | 11/1999 | Wadensweiler et al. | |
| 6,034,863 A | 3/2000 | Marohl et al. | |
| 6,050,216 A | 4/2000 | Szapucki et al. | |
| 6,073,577 A * | 6/2000 | Lilleland et al. | 118/723 E |
| 6,096,414 A | 8/2000 | Young | |
| 6,123,804 A | 9/2000 | Babassi et al. | |
| 6,131,646 A | 10/2000 | Kelley | |
| 6,165,612 A | 12/2000 | Misra | |
| 6,194,322 B1 * | 2/2001 | Lilleland et al. | 438/710 |
| 6,220,607 B1 | 4/2001 | Schneider et al. | |
| 6,331,349 B1 | 12/2001 | Kalinoski et al. | |
| 6,343,647 B2 | 2/2002 | Kim et al. | |
| 6,363,882 B1 | 4/2002 | Hao et al. | |
| 6,365,063 B2 | 4/2002 | Collins et al. | |
| 6,376,385 B2 | 4/2002 | Lilleland et al. | |

(Continued)

OTHER PUBLICATIONS

International Search Report and Written Opinion mailed Jan. 29, 2010 for PCT/US2009/004494.

(Continued)

*Primary Examiner* — Matthew Song
(74) *Attorney, Agent, or Firm* — Buchanan Ingersoll & Rooney PC

(57) ABSTRACT

A temperature-controlled hot edge ring assembly adapted to surround a semiconductor substrate supported in a plasma reaction chamber is provided. A substrate support with an annular support surface surrounds a substrate support surface. A radio-frequency (RF) coupling ring overlies the annular support surface. A lower gasket is between the annular support surface and the RF coupling ring. The lower gasket is thermally and electrically conductive. A hot edge ring overlies the RF coupling ring. The substrate support is adapted to support a substrate such that an outer edge of the substrate overhangs the hot edge ring. An upper thermally conductive medium is between the hot edge ring and the RF coupling ring. The hot edge ring, RF coupling ring and annular support surface can be mechanically clamped. A heating element can be embedded in the RF coupling ring.

16 Claims, 14 Drawing Sheets

U.S. PATENT DOCUMENTS

| | | | |
|---|---|---|---|
| 6,433,484 B1 | 8/2002 | Hao et al. | |
| 6,468,925 B2 | 10/2002 | Campbell et al. | |
| 6,475,336 B1 * | 11/2002 | Hubacek | 156/345.51 |
| 6,475,933 B1 | 11/2002 | Brown et al. | |
| 6,491,784 B2 | 12/2002 | Yamaguchi et al. | |
| 6,496,373 B1 | 12/2002 | Chung | |
| 6,651,736 B2 | 11/2003 | Chiu et al. | |
| 6,733,015 B2 | 5/2004 | Forry et al. | |
| 6,782,843 B2 | 8/2004 | Kinnard et al. | |
| 6,795,292 B2 | 9/2004 | Grimard et al. | |
| 6,818,097 B2 | 11/2004 | Yamaguchi et al. | |
| 6,824,627 B2 | 11/2004 | Dhindsa et al. | |
| 7,014,959 B2 | 3/2006 | Crawford et al. | |
| 7,017,269 B2 | 3/2006 | White et al. | |
| 7,067,432 B2 | 6/2006 | Xu et al. | |
| 7,137,444 B2 | 11/2006 | Faybishenko et al. | |
| 7,149,070 B2 | 12/2006 | Breitschwerdt et al. | |
| 7,159,537 B2 | 1/2007 | Wickramanayaka et al. | |
| 7,205,050 B2 | 4/2007 | Haas | |
| 7,208,192 B2 | 4/2007 | Bunyan et al. | |
| 7,220,937 B2 | 5/2007 | Hofman et al. | |
| 7,244,336 B2 | 7/2007 | Fischer et al. | |
| 7,250,373 B2 | 7/2007 | Mui et al. | |
| 7,252,738 B2 | 8/2007 | Tong et al. | |
| 7,282,454 B2 | 10/2007 | Gottscho et al. | |
| 7,598,150 B2 | 10/2009 | Ranish et al. | |
| 2001/0033059 A1 | 10/2001 | Forry et al. | |
| 2002/0002281 A1 | 1/2002 | Johnson et al. | |
| 2004/0083975 A1 * | 5/2004 | Tong et al. | 118/728 |
| 2004/0261946 A1 | 12/2004 | Endoh et al. | |
| 2005/0028935 A1 | 2/2005 | Wickramanayaka et al. | |
| 2005/0133160 A1 | 6/2005 | Kennedy et al. | |
| 2005/0133164 A1 * | 6/2005 | Fischer et al. | 156/345.51 |
| 2005/0196971 A1 | 9/2005 | Sen et al. | |
| 2005/0229849 A1 | 10/2005 | Silvetti et al. | |
| 2005/0241765 A1 | 11/2005 | Dhindsa et al. | |
| 2005/0241766 A1 | 11/2005 | Dhindsa et al. | |
| 2006/0043067 A1 | 3/2006 | Kadkhodayan et al. | |
| 2007/0032081 A1 * | 2/2007 | Chang et al. | 438/689 |
| 2007/0068629 A1 | 3/2007 | Shih et al. | |
| 2007/0128864 A1 * | 6/2007 | Ma et al. | 438/680 |
| 2007/0131350 A1 * | 6/2007 | Ricci et al. | 156/293 |
| 2008/0064126 A1 | 3/2008 | Gaff | |
| 2008/0066867 A1 | 3/2008 | Kim et al. | |
| 2008/0078744 A1 | 4/2008 | Wang et al. | |
| 2008/0118641 A1 | 5/2008 | Ranish et al. | |

OTHER PUBLICATIONS

The Berquist Company, Thermal Materials: Sil-Pad Products, http://www.berquistcompany.com/tm_sil_pad-print.cfm?98d=104284, Jun. 13, 2007.

S.D. Glasgow and K.B. Kittredge, Performance Testing of Thermal Interface Filler Materials in a Bolted Aluminum Interface Under Thermal/Vacuum Conditions, Jun. 2003, NASA/TM-2003-212500.

U.S. Appl. No. 61/008,152, filed Dec. 19, 2007, with Official Filing Receipt attached.

U.S. Appl. No. 12/155,739, filed Jun. 9, 2008, with Official Filing Receipt attached.

U.S. Appl. No. 11/896,375, filed Aug. 3, 2007, with Official Filing Receipt attached.

* cited by examiner

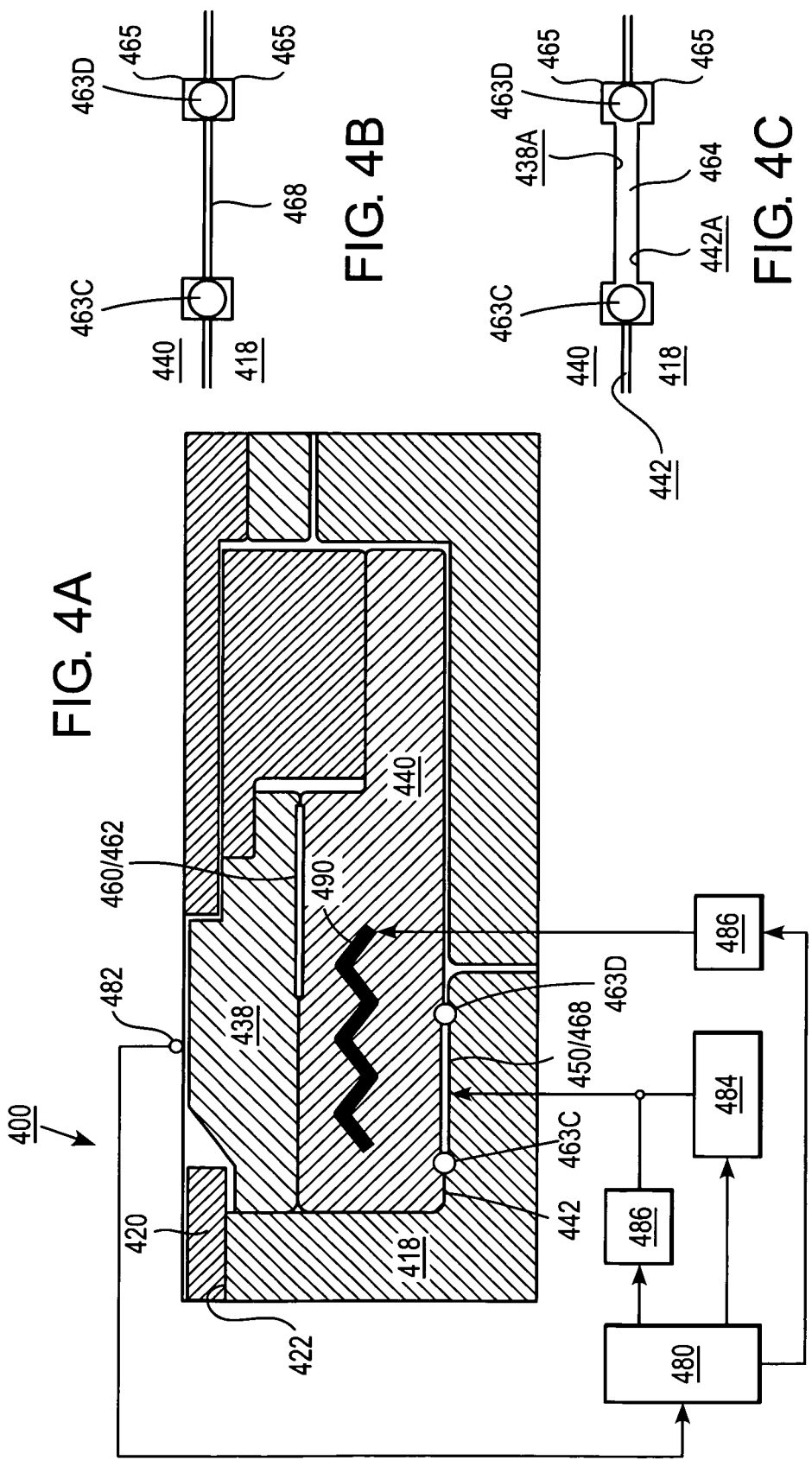

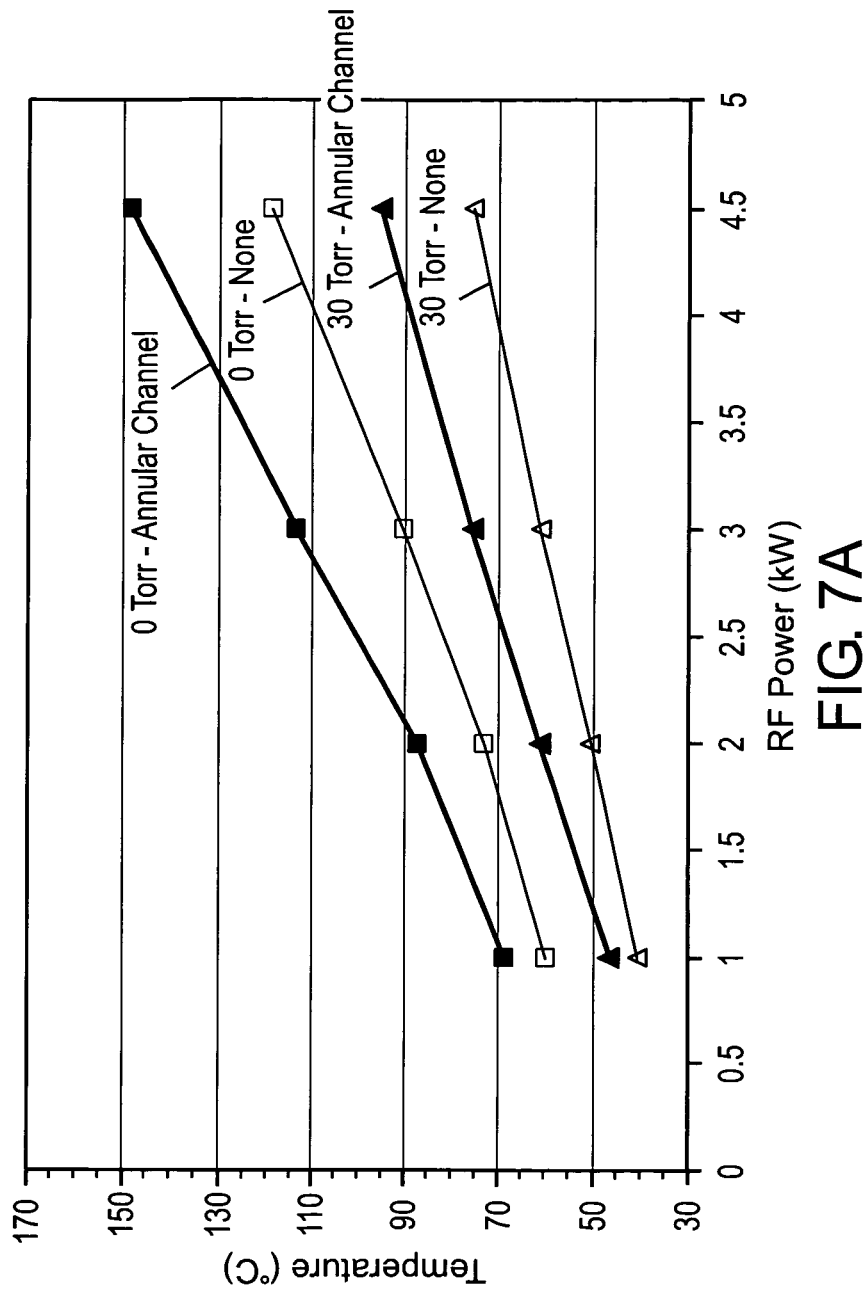

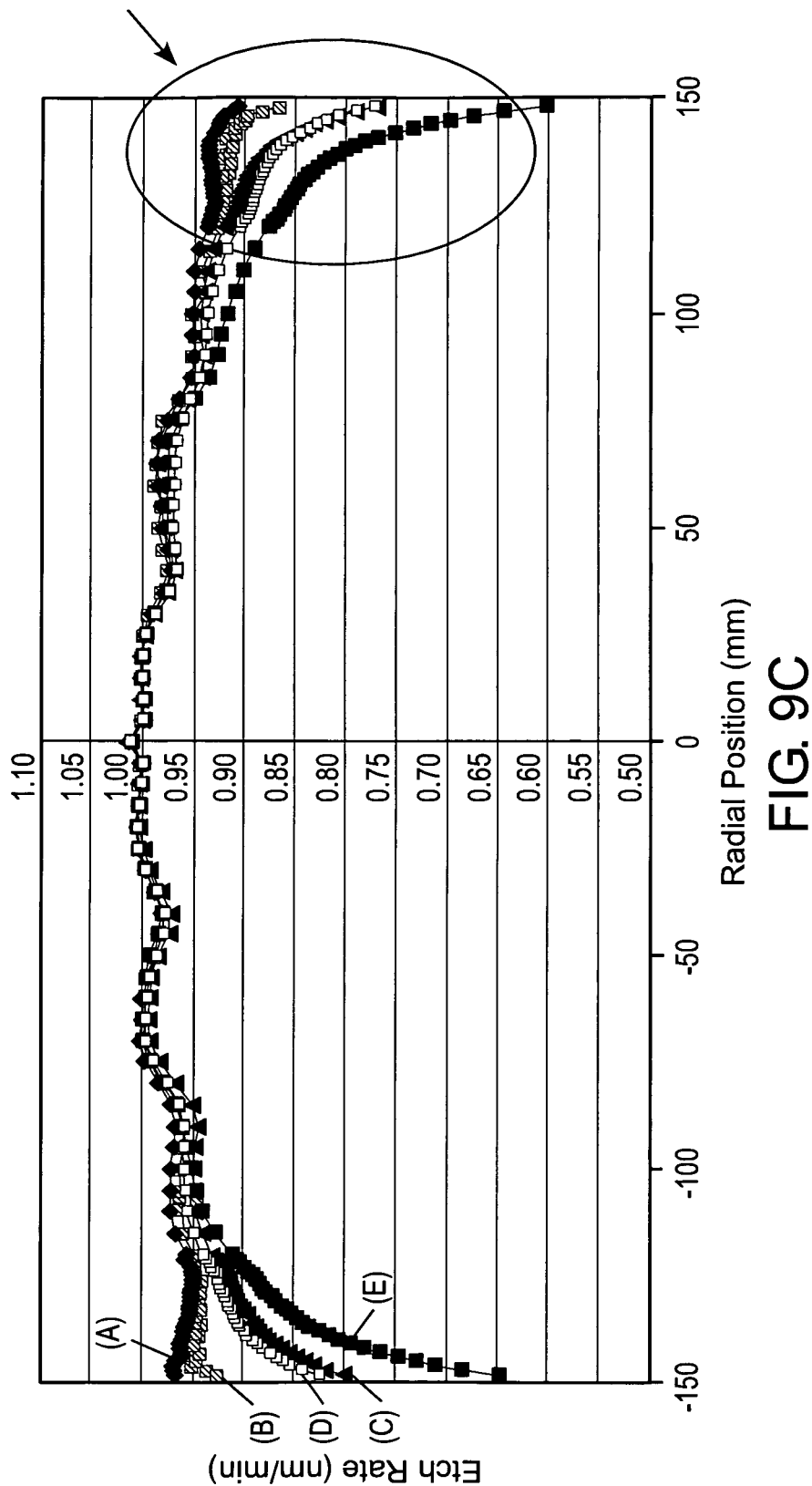

TEMPERATURE CONTROLLED HOT EDGE RING ASSEMBLY

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing top and bottom electrodes. An electric field is established between the electrodes to excite a process gas into the plasma state to process substrates in the reaction chamber.

SUMMARY

According to one embodiment, a temperature-controlled hot edge ring assembly adapted to surround a semiconductor substrate supported in a plasma reaction chamber includes a substrate support having an annular support surface surrounding a substrate support surface. A radio-frequency (RF) coupling ring overlies the annular support surface. A lower gasket is between the annular support surface and the RF coupling ring. The lower gasket is thermally and electrically conductive. A hot edge ring overlies the RF coupling ring. The substrate support is adapted to support a substrate such that an outer edge of the substrate overhangs the hot edge ring. An upper thermally conductive medium is between the hot edge ring and the RF coupling ring.

According to another embodiment, a temperature-controlled hot edge ring assembly adapted to surround a semiconductor substrate support in a plasma reaction chamber includes a substrate support with an annular support surface surrounding a substrate support surface. A radio-frequency (RF) coupling ring is mechanically clamped to the annular support surface and a thermally insulative medium is between the annular support surface and the RF coupling ring. A hot edge ring is mechanically clamped to the RF coupling ring and a thermally conductive medium is between the hot edge ring and the RF coupling ring.

According to a further embodiment, a temperature-controlled hot edge ring assembly adapted to surround a semiconductor substrate supported in a plasma reaction chamber includes a substrate support with an annular support surface surrounding a substrate support surface. A radio-frequency (RF) coupling ring is mechanically clamped to the annular support surface and a lower thermally conductive medium is between the annular support surface and the RF coupling ring. A hot edge ring is mechanically clamped to the RF coupling ring and an upper thermally conductive medium is between the hot edge ring and the RF coupling ring. The substrate support is adapted to support a substrate such that an outer edge of the substrate overhangs the hot edge ring.

BRIEF DESCRIPTION OF FIGURES

FIGS. 4A-4C show another embodiment of a hot edge ring assembly with a hot edge ring, an RF coupling ring with a heating element, and substrate support including pressurized heat transfer gas as a thermally conductive medium.

FIGS. 7A-7B illustrate temperature profiles of the hot edge ring as a function of varying static pressure of helium heat transfer gas in an annular channel.

FIGS. 9A-9C illustrate etching rate uniformity of photoresist using a hot edge ring assembly with different lower and upper thermally conductive media.

DETAILED DESCRIPTION

Figure 1A:
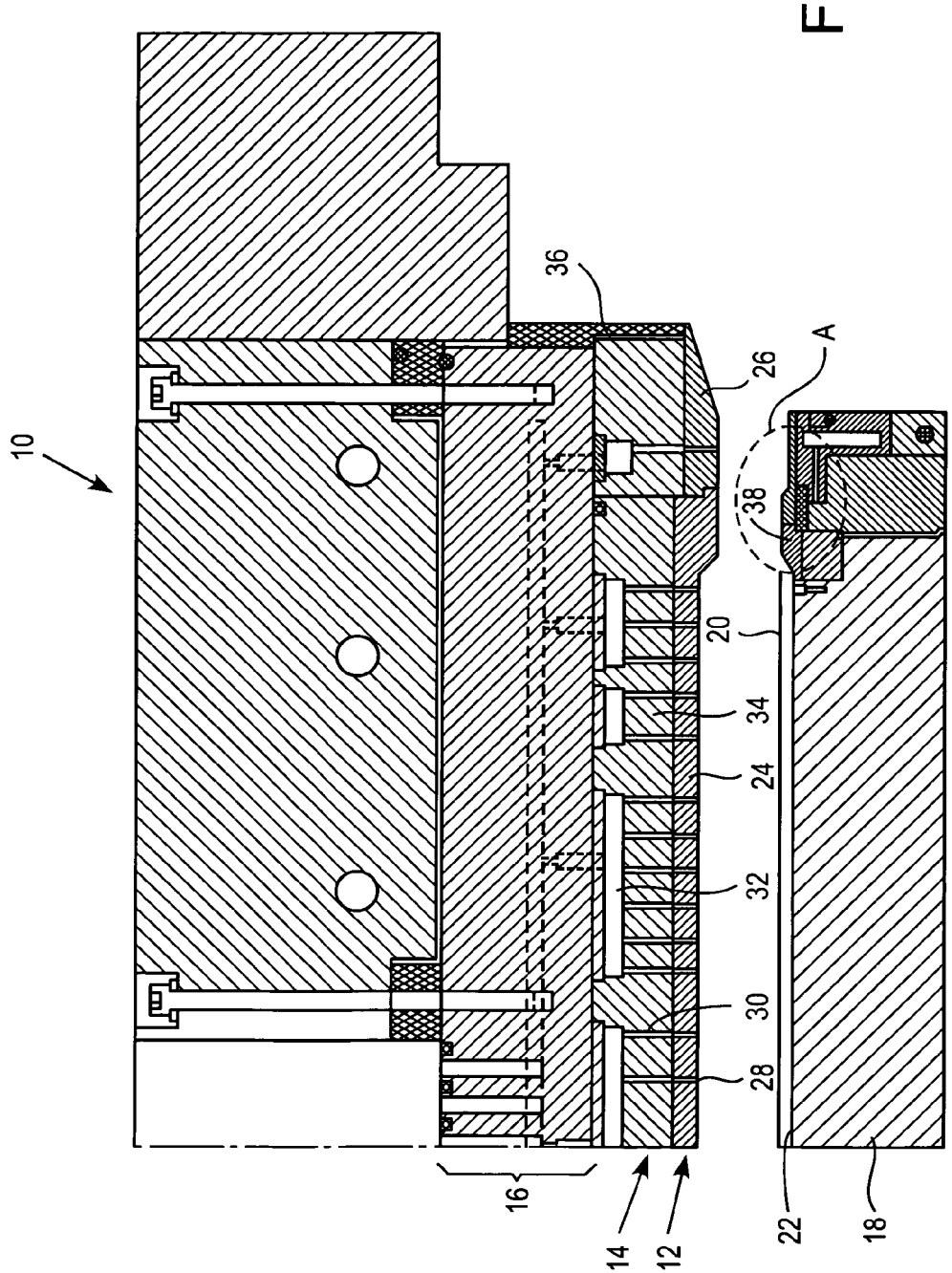
FIGS. 1A-1B illustrate a portion of an embodiment of a showerhead electrode assembly and a substrate support for a plasma processing apparatus, including a hot edge ring assembly.

The manufacturing of the integrated circuit devices includes the use of plasma etching chambers, which are capable of etching selected layers defined by openings in a photoresist mask. The processing chambers are configured to receive processing gases (i.e., etch chemistries) while a radio frequency (RF) power is applied to one or more electrodes of the processing chamber. The pressure inside the processing chamber is also controlled for the particular process. Upon applying the desired RF power to the electrode(s), the process gases in the chamber are activated such that a plasma is created. The plasma is thus generated to perform the desired etching of the selected layers of the semiconductor substrate such as a wafer. However, one of the challenges associated with plasma processing of wafers include process drift due to the plasma non-uniformities (i.e., the change of process performance over a certain amount of time).

For control of etch rate uniformity on a semiconductor substrate, such as a wafer, in particular, for matching the etch rate at the center of the wafer to the rate at the wafer edge, wafer boundary conditions are preferably designed for assuring continuity across the wafer in regard to the chemical exposure of the wafer edge, process pressure, and RF field strength. As is known, an RF bias can be applied to a wafer undergoing plasma processing by a powered electrode underlying an electrostatic clamping electrode. However, because the RF impedance path from the powered electrode through the electrostatic clamping electrode and wafer to the plasma can be different than the RF impedance path from an outer portion of the powered electrode to the plasma, a nonuniform plasma density which results at the edge of the wafer can lead to nonuniform processing of the wafer.

To alleviate such nonuniformities, a hot edge ring and a RF coupling ring has been implemented fitting around the wafer. Improved plasma uniformity can be achieved by providing an RF impedance path which is similar at the center and edge of a wafer undergoing plasma processing. The RF impedance path can be manipulated by choice of materials for the RF coupling ring. The overlying hot edge ring is a consumable part which protects the RF coupling ring from plasma erosion.

Materials for the edge ring can be selected to provide a more uniform RF impedance path at the center and edge of the wafer so as to provide more uniformity of the plasma density across the wafer. However, upon exposure to a heat source such as the RF plasma, the edge ring cannot cool adequately, which leads to a steady rise of its temperature. This temperature rise can lead to process drift (i.e., process non-uniformity) in etch rate at the edge of the wafer when multiple wafers are processed in close succession. This inability to control the temperature of the hot edge ring and RF coupling ring during plasma processing can be problematic, resulting in an increase in etch rate at the extreme wafer edge (e.g., the outer 5 to 7 mm of a 300 mm diameter silicon wafer), polymer deposition or "first wafer effects."

First wafer effects refers to secondary heating of subsequent wafers caused indirectly by the heating of the first-processed wafer. Specifically, upon completion of processing of the first wafer, the heated processed wafer and the process chamber side walls radiate heat toward the upper electrode. The upper electrode then indirectly provides a secondary heating mechanism for subsequent wafers that are processed in the chamber. As a result, the first wafer processed by the system may exhibit a larger than desired critical dimension (CD) variation than subsequent wafers processed by the system since wafer temperature variation can affect CD during etching of high aspect ratio contact vias. Subsequently processed wafers may have different and/or less CD variation than the first processed wafer due to stabilization of temperature in the chamber. Accordingly, since process drift can be caused by the steady increase in the temperature of the edge ring over the processing of multiple wafers, a hot edge ring assembly, which allows improved cooling of the edge ring or temperature control of the edge ring before the next wafer is processed and thereby reduces etch rate drift is desirable.

FIG. 1A illustrates an exemplary embodiment of a showerhead electrode assembly 10 for a plasma processing apparatus in which semiconductor substrates, e.g., silicon wafers, are processed. The showerhead electrode assembly 10 includes a showerhead electrode including a top electrode 12, a backing member 14 secured to the top electrode 12, and a thermal control plate 16. A substrate support 18 (only a portion of which is shown in FIG. 1) including a bottom electrode and an electrostatic clamping electrode (e.g., electrostatic chuck) is positioned beneath the top electrode 12 in the vacuum processing chamber of the plasma processing apparatus. A substrate 20 subjected to plasma processing is electrostatically clamped on substrate support surface 22 of the substrate support 18.

In the illustrated embodiment, the top electrode 12 of the showerhead electrode includes an inner electrode member 24, and an optional outer electrode member 26. The inner electrode member 24 is preferably a cylindrical plate (e.g., a plate composed of silicon). The inner electrode member 24 can have a diameter smaller than, equal to, or larger than a wafer to be processed, e.g., up to 12 inches (300 mm) or larger if the plate is made of silicon. In a preferred embodiment, the showerhead electrode assembly 10 is large enough for processing large substrates, such as semiconductor wafers having a diameter of 300 mm or larger. For 300 mm wafers, the top electrode 12 is at least 300 mm in diameter. However, the showerhead electrode assembly can be sized to process other wafer sizes or substrates having a non-circular configuration.

In the illustrated embodiment, the inner electrode member 24 is wider than the substrate 20. For processing 300 mm wafers, the outer electrode member 26 is provided to expand the diameter of the top electrode 12 from about 15 inches to about 17 inches. The outer electrode member 26 can be a continuous member (e.g., a continuous poly-silicon ring), or a segmented member (e.g., including 2-6 separate segments arranged in a ring configuration, such as segments composed of silicon). In embodiments of the top electrode 12 that include a multiple-segment, outer electrode member 26, the segments preferably have edges, which overlap each other to protect an underlying bonding material from exposure to plasma.

The inner electrode member 24 preferably includes multiple gas passages 28 extending through and in correspondence with multiple gas passages 30 formed in the backing member 14 for injecting process gas into a space between the top electrode 12 and the substrate support 18. Backing member 14 includes multiple plenums 32 to distribute process gases to the gas passages 28 and 30 in the inner electrode member 24 and backing member 14, respectively.

Silicon is a preferred material for plasma exposed surfaces of the inner electrode member 24 and the outer electrode member 26. High-purity, single crystal silicon minimizes contamination of substrates during plasma processing and also wears smoothly during plasma processing, thereby minimizing particles. Alternative materials that can be used for plasma-exposed surfaces of the top electrode 12 include SiC or AlN, for example.

In the illustrated embodiment, the backing member 14 includes a backing plate 34 and a backing ring 36, extending around the periphery of backing plate 34. In the embodiment, the inner electrode member 24 is co-extensive with the backing plate 34, and the outer electrode member 26 is co-extensive with the surrounding backing ring 36. However, the backing plate 34 can extend beyond the inner electrode member 24 such that a single backing plate can be used to support the inner electrode member 24 and the outer electrode member 26. The inner electrode member 24 and the outer electrode member 26 are preferably attached to the backing member 14 by a bonding material and/or mechanical fasteners.

The backing plate 30 and backing ring 36 are preferably made of a material that is chemically compatible with process gases used for processing semiconductor substrates in the plasma processing chamber, and is electrically and thermally conductive. Exemplary suitable materials that can be used to make the backing member 14 include aluminum, aluminum alloys, graphite and SiC.

The top electrode 12 can be attached to the backing plate 34 and backing ring 36 with a suitable thermally and electrically conductive elastomeric bonding material that accommodates thermal stresses, and transfers heat and electrical energy between the top electrode 12 and the backing plate 34 and backing ring 36. The use of elastomers for bonding together surfaces of an electrode assembly is described, for example, in commonly-owned U.S. Pat. No. 6,073,577, which is incorporated herein by reference in its entirety.

In a capacitively coupled RF plasma chamber for processing large substrates such as 300 mm wafers, a secondary ground may also be used in addition to the ground electrode. For example, substrate support 18 can include a bottom electrode which is supplied RF energy at one or more frequencies and process gas can be supplied to the interior of the chamber through showerhead electrode 12 which is a grounded upper electrode. A secondary ground, located outwardly of the bottom electrode in substrate support 18 can include an electrically grounded portion which extends generally in a plane containing the substrate 20 to be processed but separated by a hot edge ring 38. Hot edge ring 38 can be of electrically conductive or semiconductive material which becomes heated during plasma generation.

Figure 1B:
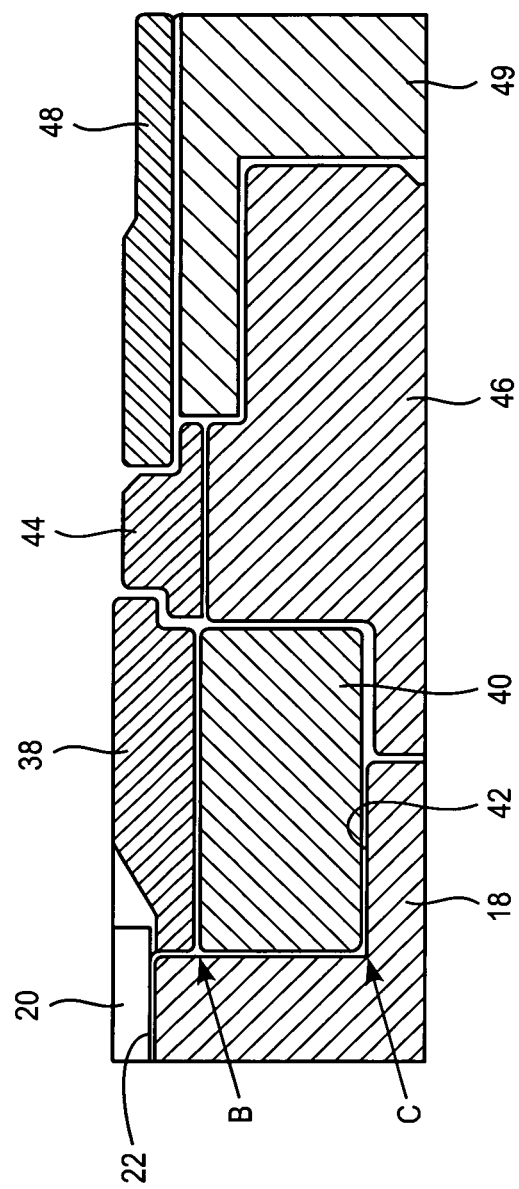

FIG. 1B is an enlarged view of the region A in FIG. 1A surrounding hot edge ring 38. For control of etch rate uniformity on substrate 20 and matching the etch rate at the center of the substrate to the rate at the substrate edge, substrate boundary conditions are preferably designed for assuring continuity across the substrate in regard to the chemical exposure of the substrate edge, process pressure, and RF field strength. In order to minimize substrate contamination, the hot edge ring 38 is manufactured from a material compatible to the substrate itself. In an example, hot edge ring materials can include silicon, graphite, silicon carbide or the like. In another example, hot edge ring materials can include quartz.

Hot edge ring 38 overlies RF coupling ring 40 which is placed on an annular support surface 42 surrounding substrate support surface 22, on the outer periphery of substrate support 18. Substrate support 18 is adapted to support substrate 20, such that the substrate's outer edge overhangs hot edge ring 38. Substrate support 18 can be actively cooled with a chilled liquid circulating in cooling passages located in the interior of substrate support (not shown in FIG. 1A). The material for RF coupling ring 40 is chosen for tapering the RF field strength at the edge of the substrate 20 to enhance etch rate uniformity. For example, RF coupling ring 40 can be made of a ceramic (e.g. quartz, aluminum oxide, aluminum nitride) or a conductive material (e.g., aluminum, silicon, silicon carbide). Surrounding hot edge ring 38 is hot edge ring cover 44, which is composed of a dielectric material. Hot edge ring cover 44 overlies focus ring 46, which confines plasma in an area above the substrate 20 and can be composed of quartz.

Hot edge ring cover 44 overlies focus ring 46, which confines plasma in an area above the substrate 20 and hot edge ring cover 44 can be composed of quartz. Further surrounding hot edge ring cover 44 is ground ring cover 48. Hot edge ring cover 44 protects the ground extension from attack by the plasma. For example, hot edge ring cover 44 and ground ring cover 48 can be composed of quartz or yttria. Ground extension 49 can be composed of aluminum.

During plasma processing of substrate 20, hot edge ring 38, RF coupling ring 40 and substrate support 18 are exposed to a vacuum environment (i.e., less than 50 mTorr). As a result, a vacuum is formed at the interface B between hot edge ring 38 and RF coupling ring 40; and at the interface C between RF coupling ring 40 and substrate support 18. As the temperature of the hot edge ring 38 increases during exposure to RF power, the transfer of heat from hot edge ring 38 to RF coupling ring 40 and substrate support 18 via thermal conduction is minimal, due to the presence of a vacuum at the appropriate interfaces. Thus, a need exists for the ability to control the temperature of hot edge ring 38 during the plasma processing of substrate 20.

Figure 2A:
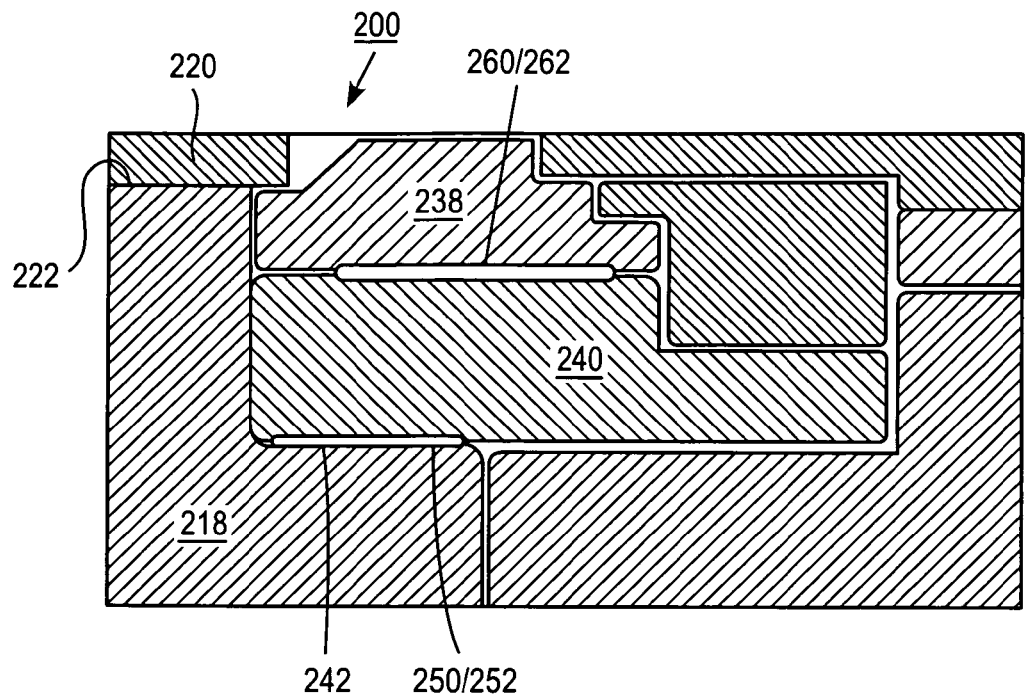
FIGS. 2A-2B show an embodiment of a hot edge ring assembly with a hot edge ring, an RF coupling ring and substrate support with an annular support, including lower and upper thermally conductive media.

FIG. 2A illustrates one embodiment of a temperature controlled hot edge ring assembly 200. Substrate support 218 includes annular support surface 242 surrounding substrate support surface 222, on the outer periphery of substrate support 218. RF coupling ring 240 overlies annular support surface 242 with a lower thermally conductive medium 250 between annular support surface 242 and RF coupling ring 240. Hot edge ring 238 overlies RF coupling ring 240 with an upper thermally conductive medium 260 between hot edge ring 238 and RF coupling ring 240. Substrate support 218 is adapted to support substrate 220, such that the outer edge of substrate 220 overhangs hot edge ring 238.

In one embodiment, lower thermally conductive medium 250 comprises a lower gasket 252 and upper thermally conductive medium 260 comprises an upper gasket 262. Lower gasket 252 and upper gasket 262 are thermally and electrically conductive gaskets. In a preferred embodiment, lower gasket 252 and upper gasket 262 are composed of a laminate of metal or polymer materials; a silicone-based sheet (e.g., λGEL® COH-4000, available from GELTECH, Tokyo, Japan); a laminate of aluminum (or an aluminum alloy) and filled silicone rubber (e.g., Q-PAD® II, manufactured by The Bergquist Company, Chanhassen, Minn.); or a laminate of polyimide material and filled silicon rubber (e.g., SIL-PAD® K-10, manufactured by The Bergquist Company, Chanhassen, Minn.); or a polyimide material (e.g., KAPTON® polyimide film, manufactured by DU PONT®).

Other exemplary materials for lower gasket 252 and upper gasket 262 can include a thermal filler material such as a silicone filled with boron nitride (e.g., CHO-THERM® 1671, manufactured by CHOMERICS), a graphite material (e.g., eGRAF® 705, manufactured by GRAFTECH), an indium foil, or a phase change material (PCM) (e.g., T-pcm HP105, manufactured by THERMAGON).

Figure 2B:
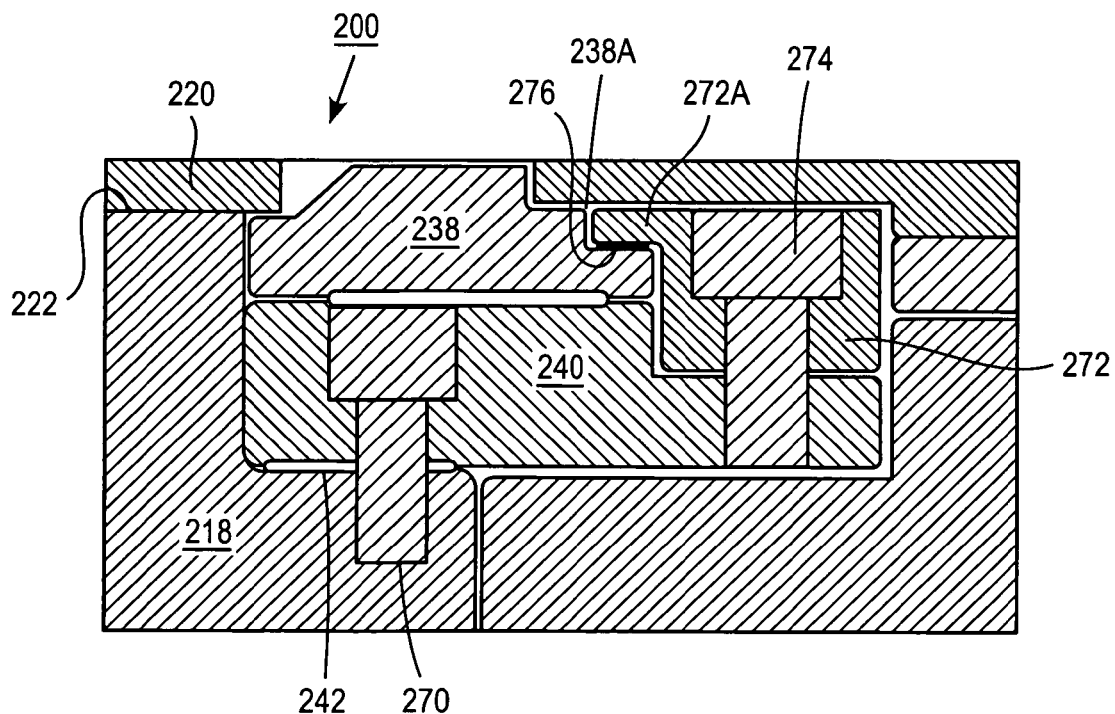

FIG. 2B illustrates an embodiment of temperature controlled hot edge ring assembly 200 in which hot edge ring 238 is mechanically clamped to RF coupling ring 240; and RF coupling ring 240 is mechanically clamped to annular support surface 242. RF coupling ring 240 can be bolted to annular support surface 242 with lower bolts 270 (e.g. 2 to 12 circumferentiality spaced apart bolts). Hot edge ring 238 is mechanically clamped to RF coupling ring 240 with clamping ring 272, which includes radially extending flange 272A. Hot edge ring 238 includes a peripheral recess 238A. Radially extending flange 272A is configured to mate with peripheral recess to secure hot edge ring 238 to RF coupling ring 272. Clamping ring 272 is bolted to RF coupling ring with upper bolts 274 (e.g. 2 to 12 circumferentiality spaced apart bolts). To prevent damage to clamping ring 272 and hot edge ring 238 during clamping, flat polyimide ring 276 (e.g., KAPTON® polyimide film) can be placed between clamping ring 272 and hot edge ring 238. Hot edge ring 238 can be clamped to RF coupling ring 240 at a torque from about 1 ft.-lb. to about 10 ft.-lb. Likewise, RF coupling ring 240 can be clamped to annular support surface 242 at a torque from about 1 ft.-lb. to about 10 ft.-lb.

Figure 3B:
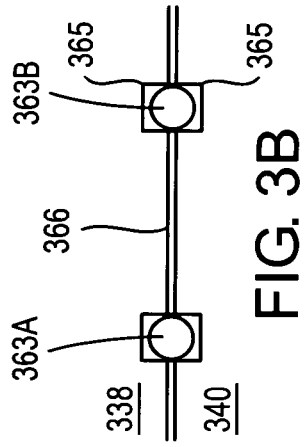
FIGS. 3A-3C show another embodiment of a hot edge ring assembly with a hot edge ring, an RF coupling ring and substrate support, including pressurized heat transfer gas as a thermally conductive medium.
Figure 3C:
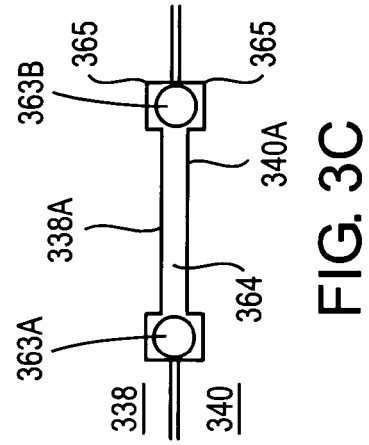
Figure 3A:
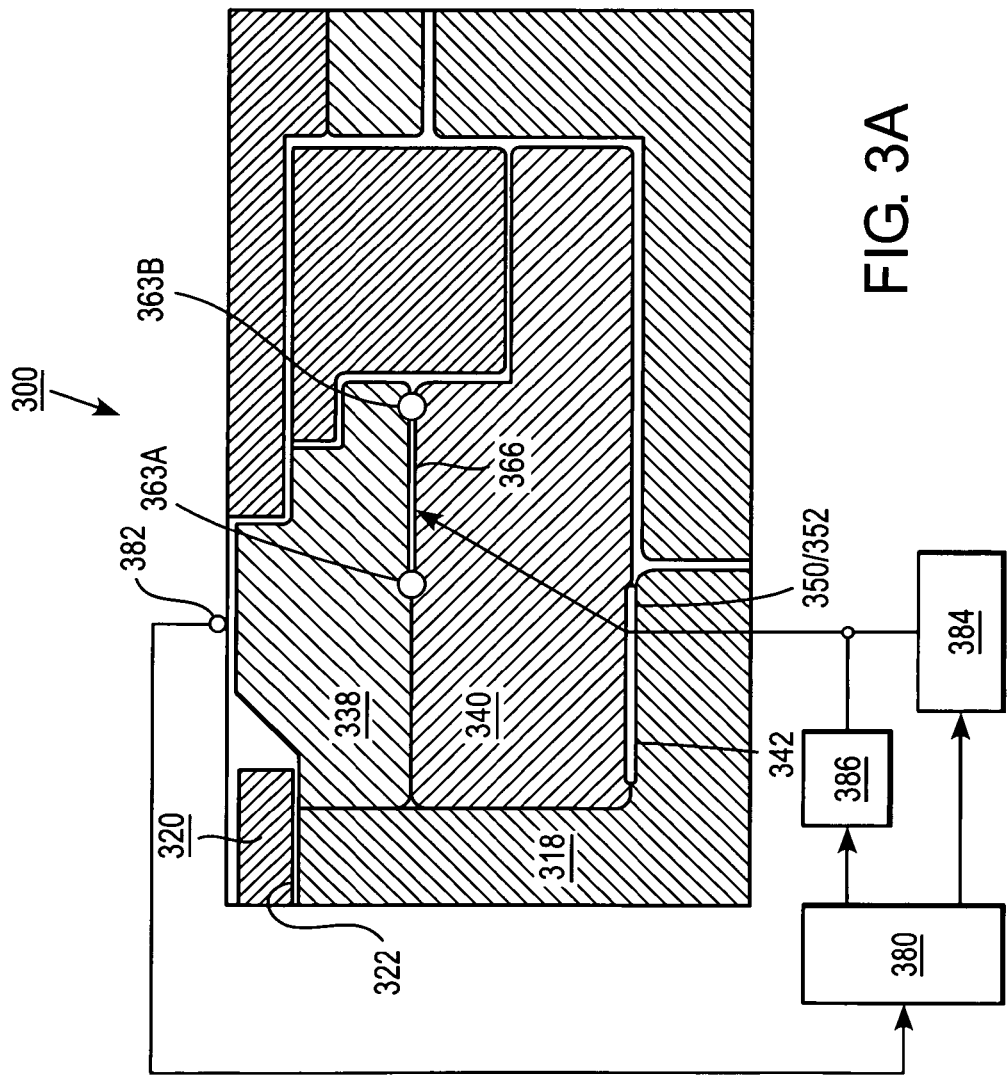

FIG. 3A illustrates an additional embodiment a temperature controlled hot edge ring assembly 300, in which a pressurized heat transfer gas is used for upper thermally conductive medium 360. Substrate support 318 includes annular support surface 342 surrounding substrate support surface 322, on the outer periphery of substrate support 318. RF coupling ring 340 overlies annular support surface 342 with lower gasket 352 as lower thermally conductive medium 350 between annular support surface 342 and RF coupling ring 340. Hot edge ring 338 overlies RF coupling ring 340 with an upper thermally conductive medium 360 between hot edge ring 338 and RF coupling ring 340.

Upper thermally conductive medium 360 includes upper inner O-ring 363A and upper outer O-ring 363B concentrically arranged. Hot edge ring 338, RF coupling ring 340, upper inner O-ring 363A and upper outer O-ring 363 define an upper volume 366. Upper volume 366 is adapted to contain a volume of pressurized heat transfer gas, including helium, neon, argon or nitrogen. In one embodiment, the static pressure of helium in upper volume 366 can be up to about 30 Torr. In a preferred embodiment, O-rings are composed of heat resistant fluoroelastomer (e.g., VITON® fluoroelastomer, manufactured by DUPONT®).

As illustrated in FIG. 3B, upper inner O-ring 363A and upper outer O-ring 363B can be seated in grooves 365 formed in RF coupling ring 340 and hot edge ring 338. In another embodiment, as illustrated in FIG. 3C, upper inner O-ring 363A, upper outer O-ring 363B, grooves 365 and annular channel 364 are concentrically arranged, such that upper inner O-ring 363A and upper outer O-ring 363B surround annular channel 364. Annular channels 364 minimize the surface contact between heat transfer gas exposed surface 338A of hot edge ring 338 and heat transfer gas exposed surface 340A of RF coupling ring 340, to provide more precise control over thermal conductivity by adjusting the pressure of heat transfer gas in upper volume 366 (e.g., up to 30 Torr). In one embodiment, the height of annular channel 364 can be from about 1 mil to about 5 mils.

Although the FIG. 3A embodiment illustrates lower thermally conductive medium 350 as a lower gasket 352; and upper thermally conductive medium 360 as upper volume 366 defined by hot edge ring 338, RF coupling ring 340, upper inner O-ring 363A and upper outer O-ring 363B, it is understood that lower thermally conductive medium 350 could also be a lower volume of pressurized heat transfer gas (i.e., defined by a lower inner O-ring, a lower outer O-ring, annular support surface 342 and RF coupling ring 340). Likewise, and upper thermally conductive medium 360 could be an upper gasket.

FIG. 3A also illustrates controller 380, temperature sensor 382, heat transfer gas source 384 and vacuum pump 386. Temperature sensor 382 is adapted to measure a temperature of hot edge ring 338 during plasma processing and supply input signals to controller 380. Heat transfer gas source 384 and vacuum pump 386 are in fluid communication with upper volume 366. Gas source 384 is operable to increase a static pressure in upper volume 366 in response to controller 380. Likewise, vacuum pump is operable to evacuate volume 366 in response to controller 380.

During plasma processing of substrate 320 in a plasma processing chamber with temperature controlled hot edge ring assembly 300, substrate 320 is supported on substrate support surface 322. A process gas is introduced into the processing chamber and the process gas is energized into a plasma state. A temperature of hot edge ring 338 is measured. If the temperature of hot edge ring 338 is below a target temperature, the pressure of heat transfer gas in upper volume 366 is decreased. This decrease in heat transfer gas pressure in upper volume 366 restricts the transfer of heat from hot edge ring 338 to RF coupling ring 340 (i.e. a thermal choke), which permits the temperature of hot edge ring 338 to increase from exposure to RF plasma. If the temperature of hot edge ring 338 is above a target temperature, the pressure of heat transfer gas in upper volume 366 is increased. This increase in heat transfer gas pressure in upper volume 366 facilitates the transfer of heat from hot edge ring 338 to RF coupling ring 340 to the temperature controlled substrate support 318. During plasma processing of the substrate 320, the temperature of hot edge ring 338 can be continuously monitored and the pressure of heat transfer gas in upper volume 366 can be adjusted accordingly to maintain hot edge ring 338 at a desirable target temperature. Plasma processing of substrate 320 can include plasma etching of a semiconductor material, metal or dielectric material or; deposition of a conductive or dielectric material.

FIG. 4A illustrates an additional embodiment of active temperature controlled hot edge ring assembly 400 including heating element 490 embedded in RF coupling ring 440. Substrate support 418 includes annular support surface 442 surrounding substrate support surface 422, on the outer periphery of substrate support 418. RF coupling ring 440 overlies annular support surface 442 with lower thermally conductive medium 450 between annular support surface 442 and RF coupling ring 440. Hot edge ring 438 overlies RF coupling ring 440 with upper gasket 462 as upper thermally conductive medium 460 between hot edge ring 438 and RF coupling ring 440.

Lower thermally conductive medium 450 includes lower inner O-ring 463C and lower outer O-ring 463D concentrically arranged. Annular support surface 442, RF coupling ring 440, lower inner O-ring 463C and lower outer O-ring 463D define lower volume 468. Lower volume 468 is adapted to contain a volume of pressurized heat transfer gas, including helium, neon, argon or nitrogen.

As illustrated in FIG. 4B, lower inner O-ring 463C and lower outer O-ring 463D can be seated in grooves 465 formed in RF coupling ring 440. In another embodiment, as illustrated in FIG. 4C, lower inner O-ring 463C, lower outer O-ring 463D, grooves 465 and annular channel 464 are concentrically arranged, such that lower inner O-ring 463C and lower outer O-ring 463D surround annular channel 464. Annular channel 464 minimizes the surface contact between heat transfer gas exposed surface 442A of annular support surface 442 and heat transfer gas exposed surface 440A of RF coupling ring 440, to provide more precise control over thermal conductivity by adjusting the pressure of heat transfer gas in upper volume 468 (e.g., up to 30 Torr). In one embodiment, the height of annular channel 464 can be from about 1 mil to about 5 mils.

FIG. 4A also illustrates controller 480, temperature sensor 482, heat transfer gas source 484, vacuum pump 486 and power supply 488. Temperature sensor 482 is adapted to measure a temperature of hot edge ring 438 during plasma processing and supply input signals to controller 480. Heat transfer gas source 484 and vacuum pump 486 are in fluid communication with lower volume 468. Gas source 484 is operable to increase a static pressure in lower volume 468 in response to controller 480. Likewise, vacuum pump 486 is operable to evacuate volume 466 in response to controller 480. Power supply 488 is connected to heating element 490 and supplies power to heating element 490 in response to controller 480.

During plasma processing of substrate 420 in a plasma processing chamber with active temperature controlled hot edge ring assembly 400, substrate 420 is supported on substrate support surface 422. A process gas is introduced into the processing chamber and the process gas is energized into a plasma state. A temperature of hot edge ring 438 is measured.

If the temperature of hot edge ring 438 is below a target temperature, RF coupling ring 440 is heated by supplying power from power supply 488 to heating element 490. In one embodiment, the target temperature is from about 40° C. to about 200° C. Upper gasket 462 between RF coupling ring 440 and hot edge ring 438 facilitates the transfer of heat from RF coupling ring 440 to the hot edge ring 438. While power is supplied from power supply 488 to heating element 490, the pressure of heat transfer gas in lower volume 468 is decreased. This decrease in heat transfer gas pressure in lower volume 468 restricts the transfer of heat from the heating element 490 to temperature controlled substrate support 418 (i.e., thermal choke).

If the temperature of hot edge ring 438 is above a target temperature, the power from power supply 488 is terminated (if heating element 490 is active) and the pressure of heat transfer gas in lower volume 468 is increased. This increase in heat transfer gas pressure in lower volume 468 facilitates the transfer of heat from hot edge ring 438 to RF coupling ring 440 to the temperature controlled substrate support 418.

During plasma processing of the substrate 420, the temperature of hot edge ring 438 can be continuously monitored and the pressure of heat transfer gas in lower volume 468 and power to heating element 490 can be adjusted accordingly to maintain hot edge ring 438 at a desirable target temperature.

Example 1

A series of tests were performed to determine the effectiveness of lower thermally conductive medium 250 and upper thermally conductive medium 260 in the FIG. 2A embodiment in dissipating heat from hot edge ring 238 during plasma processing.

Tests were performed in an EXELAN® FLEX™ etching system, manufactured by Lam Research Corporation, located in Fremont, Calif. For each test, four 300 mm silicon wafers were subjected to plasma processing for about 1 minute. A gas mixture of 25 SCCM $O_2$/35 SCCM $C_4F_8$/500 SCCM Ar was introduced into the etch chamber at a pressure of 45 mTorr. Dual-frequency power was applied to a bottom electrode, about 1000 W at a frequency of about 2 MHz and about 1000 W at a frequency of 27 MHz (2 kW of total power). The temperature of hot edge ring 238 was measured with an fiber optic temperature probe during plasma processing. Hot edge ring 238 and RF coupling ring 240 were mechanically clamped at a torque of about 2 in.-lb. to about 6 in.-lb. Materials for lower thermally conductive medium 250 and upper thermally conductive medium 260 included λGEL® COH-4000 gaskets, Q-PAD® II gaskets and KAPTON® gaskets.

Figure 5:
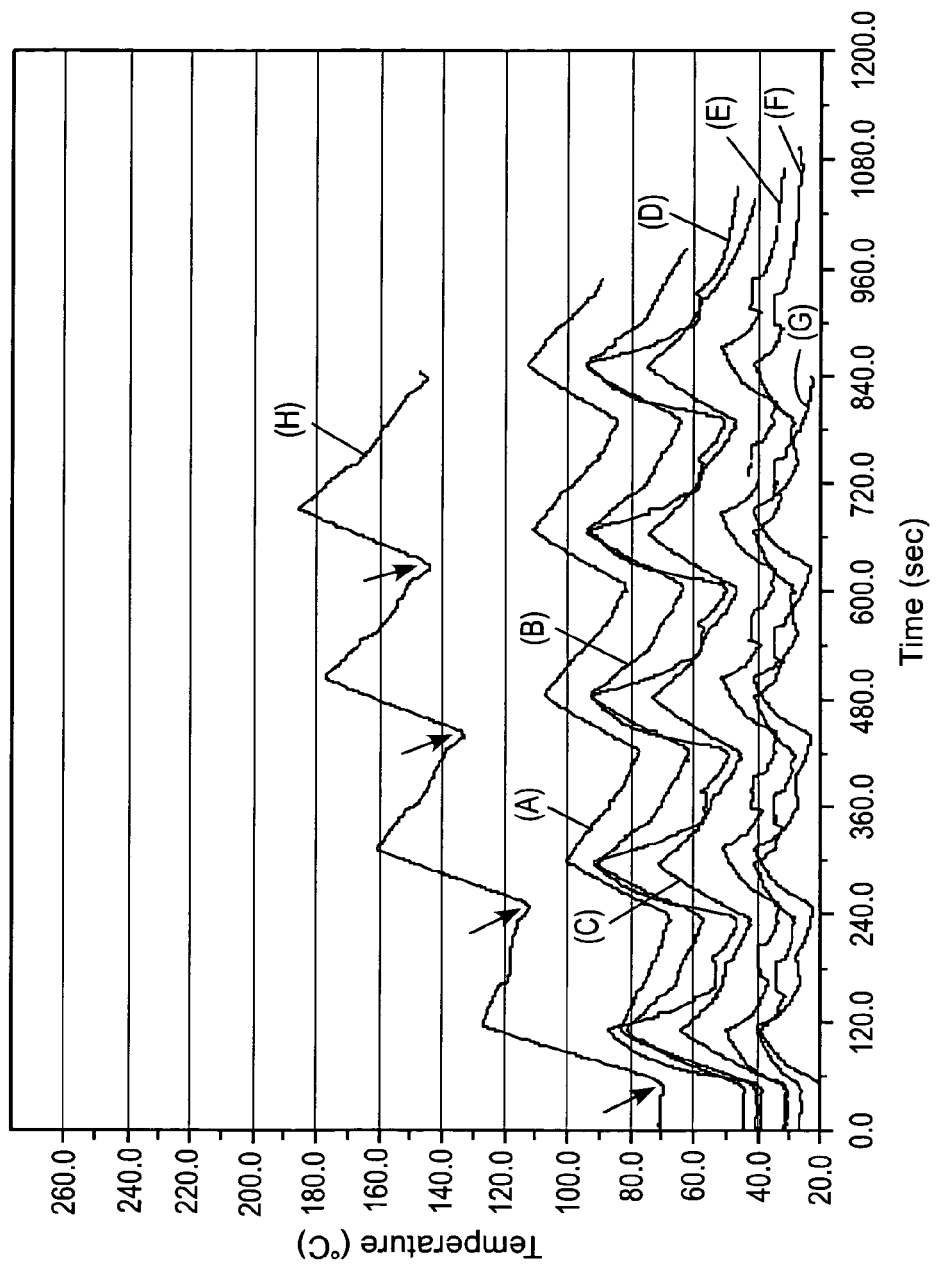
FIG. 5 illustrates temperature profiles of the hot edge ring during multiple plasma processing cycles using different lower and upper thermally conductive media.

FIG. 5 illustrates temperature profiles of the hot edge ring as a function of time for four plasma processing cycles at a total power of 2 kW. From FIG. 5, eight thermal conductive media were tested: (A) Q-PAD® lower gasket; KAPTON® upper gasket with a 2 in.-lb. torque; (B) Q-PAD® lower gasket; KAPTON® upper gasket with a 4 in.-lb. torque; (C) Q-PAD® lower gasket; KAPTON® upper gasket with a 6 in.-lb. torque; (D) Q-PAD® lower and upper gasket with a 2 in.-lb. torque; (E) Q-PAD® lower and upper gasket with a 4 in.-lb. torque; (F) Q-PAD® lower and upper gasket with a 6 in.-lb. torque; (G) λGEL upper gasket; no lower thermally conductive medium; and (H) no lower and upper thermally conductive media.

For each of the temperature profiles (A)-(H) in FIG. 5, each local temperature minima represents the beginning of the next plasma processing cycle. As illustrated in temperature profile (H) (no upper or lower thermally conductive media), the temperature of each local minima (indicated by the arrows in FIG. 5) progressively increases with each repeated plasma processing cycle. However, for temperature profiles (A)-(G), each local temperature minima either increased at a slower rate or remained constant. FIG. 5 illustrates that lower thermally conductive medium 250 and upper thermally conductive medium 260 are more effective at dissipating heat away from hot edge ring 238 and reducing first wafer effects. Testing at higher RF power (e.g., 3 kW and 4.5 kW) illustrates similar trends.

Example 2

A series of tests were performed to determine the effectiveness of pressurized helium in upper volume 366 (as upper thermally conductive medium 360) in the FIG. 3B embodiment in dissipating heat from hot edge ring 338 during plasma processing.

Tests were performed in an EXELAN® FLEX™ etching system, manufactured by Lam Research Corporation, located in Fremont, Calif. For each test, four 300 mm silicon wafers were subjected to plasma processing for 1 minute. A fifth 300 mm silicon wafer was then plasma processed for 6 minutes. A gas mixture of 25 SCCM $O_2$/35 SCCM $C_4F_8$/500 SCCM Ar was introduced into the etch chamber at a pressure of 45 mTorr. Dual-frequency power was applied to a bottom electrode, in which the total RF power was varied from about 1 kW to about 4.5 kW; and total helium pressure was varied from about 0 Torr to about 30 Torr. The temperature of hot edge ring 338 was measured with an fiber optic temperature probe during plasma processing. Hot edge ring 338 and RF coupling ring 340 were mechanically clamped at a torque of about 4 in.-lb. and about 10 in.-lb, respectively. The material for lower thermally conductive medium 350 was a Q-PAD® II gasket.

Figure 6A:
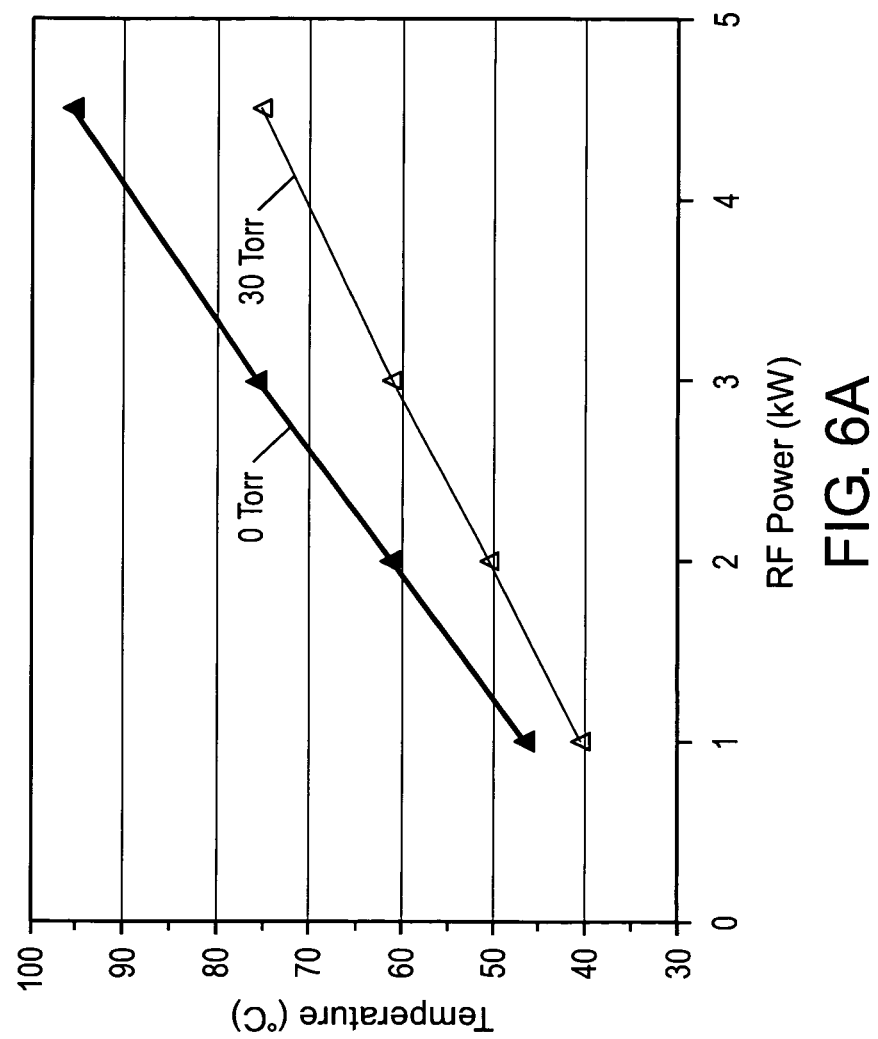
FIGS. 6A-6B illustrate temperature profiles of the hot edge ring as a function of varying static pressure of a helium heat transfer gas.

FIG. 6A illustrates temperature profiles of hot edge ring 338 as a function of total RF power for: (A) about 0 Torr of helium static pressure; and (B) about 30 Torr of helium static pressure. The temperature of hot edge ring 338 was measured after a fifth 300 mm silicon wafer was processed for about 6 minutes. As illustrated in FIG. 6A, pressurized helium at about 30 Torr can lower the temperature of the hot edge ring 338 up to 20° C. at a RF power of 4.5 kW.

Figure 6B:
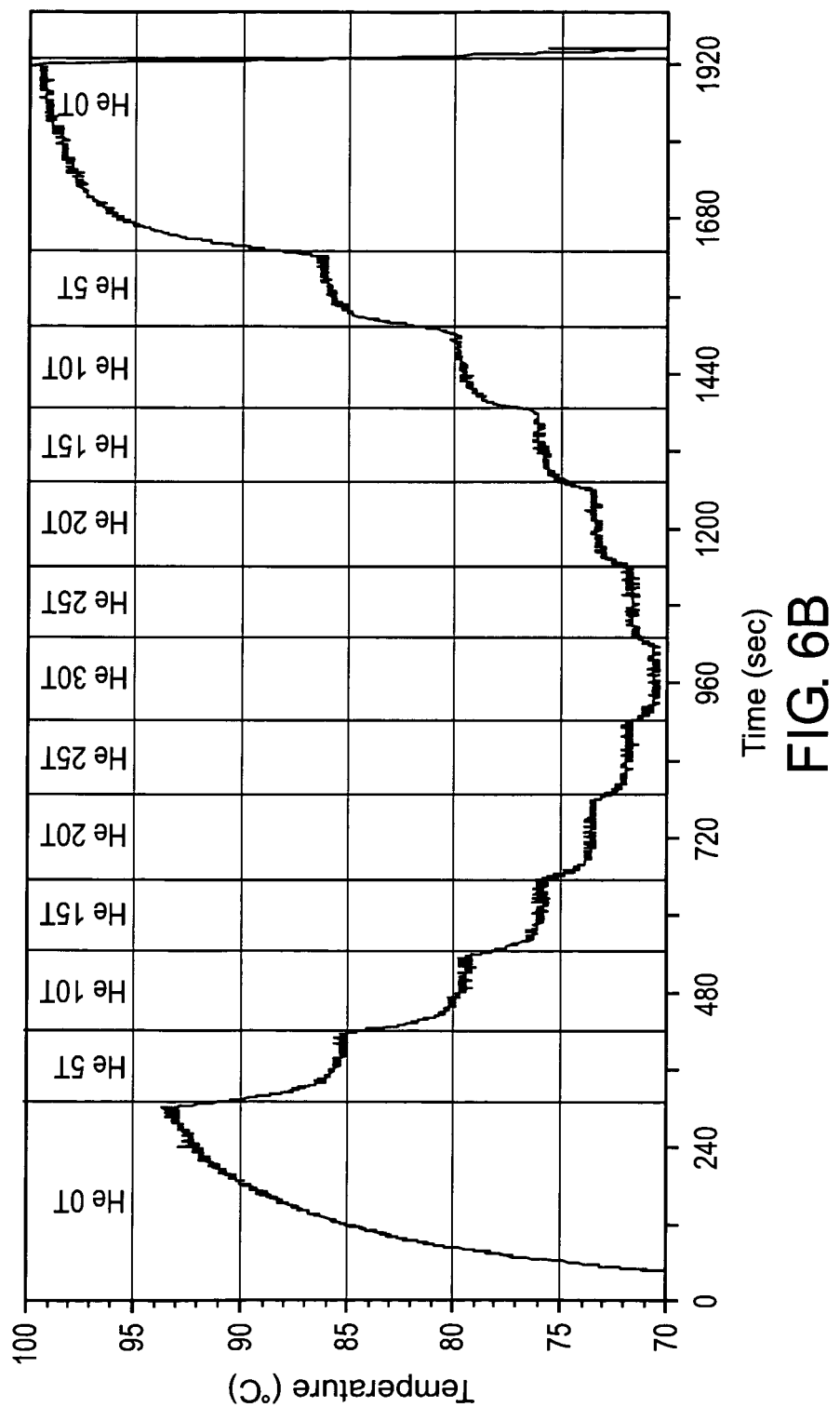

FIG. 6B illustrates the temperature response of hot edge ring 338 as static helium pressure is varied from 0 Torr to 30 Torr in 5 Torr increments. Initially, the static pressure of helium in upper volume 366 was about 0 Torr during the application of 4.5 kW RF power. After the temperature of hot edge ring 338 exceeded about 93° C., the static pressure of the helium was increased to 5 Torr for about 1 minute, resulting in a temperature decrease of the hot edge ring to about 85° C. When the static pressure was increased to 10 Torr for about 1 minute, the temperature decreased to about 85° C. When the static pressure was increased to 15 Torr for about 1 minute, the temperature decreased to about 79° C. When the static pressure was increased to 20 Torr for about 1 minute, the temperature decreased to about 73° C. When the static pressure was increased to 25 Torr for about 1 minute, the temperature decreased to about 72° C. When the static pressure was increased to 30 Torr for about 1 minute, the temperature decreased to about 70° C.

FIG. 6B illustrates that the temperature of hot edge ring 338 can be adjusted on a 1 minute time scale. Furthermore, larger temperature decreases can be achieved at lower static pressures (e.g, 0 Torr, 5 Torr or 10 Torr). Additionally, the FIG. 3B embodiment provides the ability to adjust the temperature of hot edge ring up to about 20° C. to 25° C. at a total RF power of 4.5 kW by varying helium static pressure from about 0 Torr to about 30 Torr.

Example 3

A series of tests were performed to the effectiveness of pressurized helium in annular channel 364 as upper thermally conductive medium 360 in the FIG. 3C embodiment in dissipating heat from hot edge ring 338 during plasma processing. The experimental conditions for this series of tests were the same as described above for Example 2. The height of annular channel 364 was about 2 mils.

FIG. 7A illustrates temperature profiles of hot edge ring 338 as a function of total RF power for: (A) about 0 Torr of helium static pressure; and (B) about 30 Torr of helium static pressure. The temperature of hot edge ring 338 was measured after a fifth 300 mm silicon wafer was processed for about 6 minutes. FIG. 7A also includes the temperature profiles from the FIG. 6A embodiment. As illustrated in FIG. 7A, annular channel 364 is effective to reduce the heat dissipated from hot edge ring 338, thus increasing the temperature of hot edge ring 338 in comparison to the FIG. 3B embodiment.

Figure 7B:
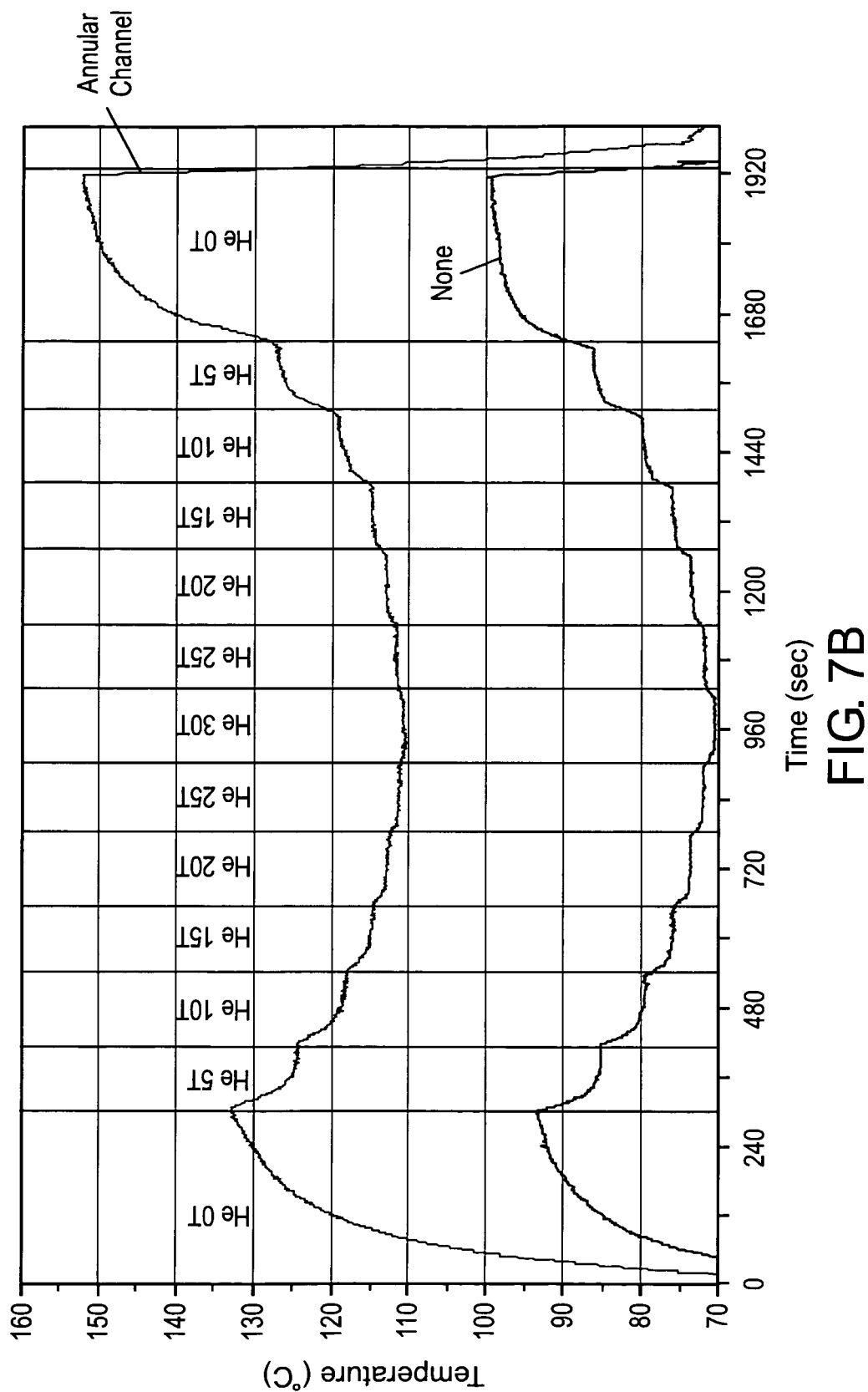

As illustrated in FIGS. 7A and 7B, the FIG. 3C embodiment provides the ability to adjust the temperature of hot edge ring 338 up to about 25° C. to 30° C. at a total RF power of 4.5 kW by varying helium static pressure from about 0 Torr to about 30 Torr. Additionally, the temperature of hot edge ring 338 increases by about 20° C. to about 50° C. at a total RF power of about 4.5 kW, in comparison to the FIG. 3B embodiment. For certain etching applications, if the temperature of hot edge ring 338 is below about 70° C. to about 90° C., undesirable polymer deposits may form on hot edge ring 338.

Example 4

Tests were performed to illustrate the effectiveness of upper inner O-ring 363A and upper outer O-ring 363B in dissipating heat from hot edge ring 338 during plasma processing. A gas mixture of 25 SCCM $O_2$/35 SCCM $C_4F_8$/500 SCCM Ar was introduced into the etch chamber at a pressure of 45 mTorr with a total RF power of 3 kW. The temperature of hot edge ring 338 was measuring during the plasma processing of a 300 mm silicon wafer. The static pressure of the helium in volume 365 was maintained at about 0 Torr. Inner O-ring 363A and outer O-ring 363B were composed of VITON® fluoroelastomer.

Figure 8:
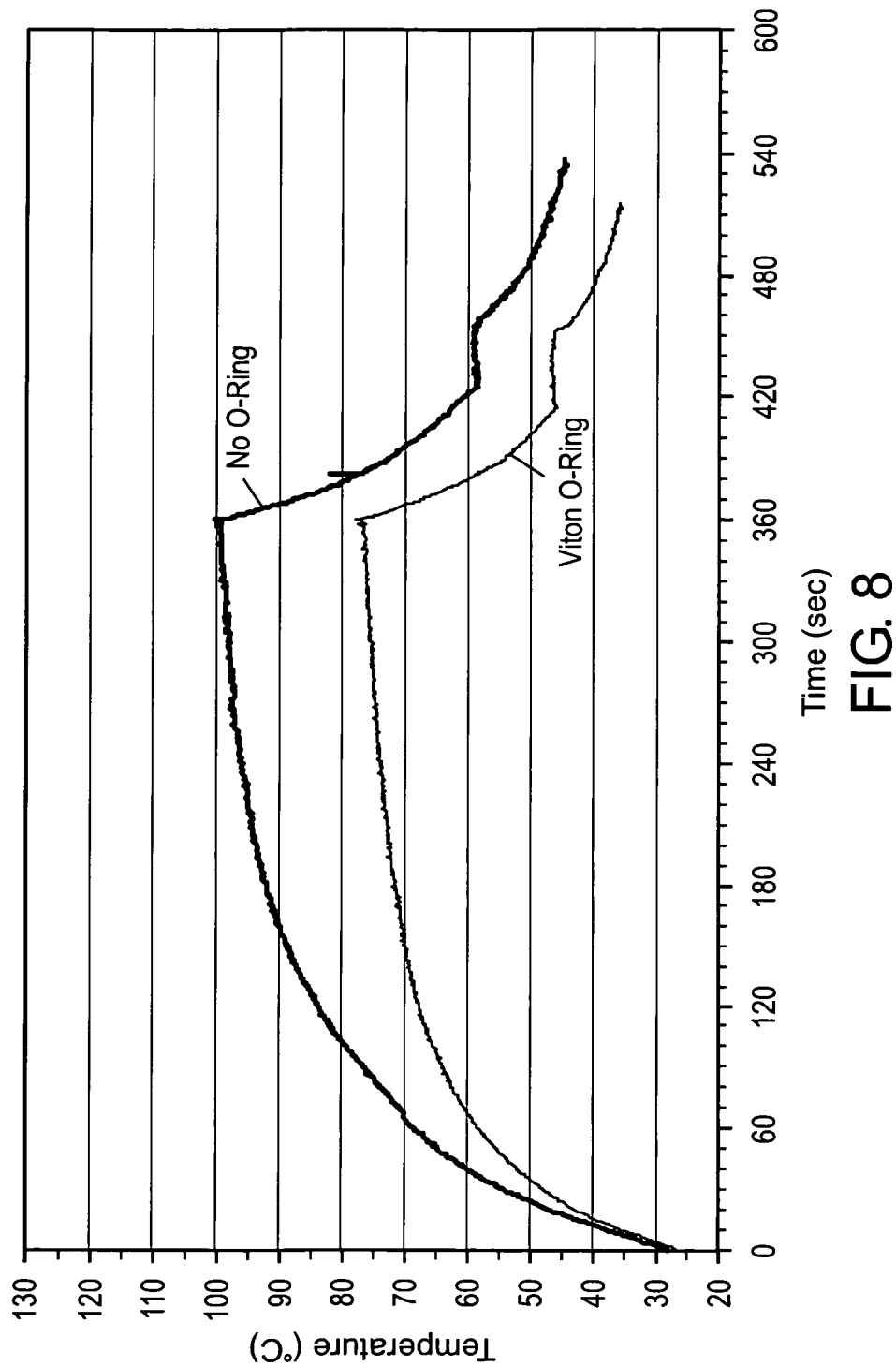
FIG. 8 illustrates the effects of O-rings on temperature profiles of the hot edge ring.

FIG. 8 illustrates a temperature profile of the hot edge ring as a function of time during plasma processing at a total RF power of 3 kW. From FIG. 7, two conditions were tested: (A) upper inner O-ring and upper outer O-ring at a static pressure of about 0 Torr; and (B) no O-rings at a static pressure of about 0 Torr. As seen in FIG. 8, the effect of VITON® fluoroelastomer O-rings was to decrease the temperature of the hot edge ring by about 25° C. after about 3 minutes of plasma processing at a total RF power of 3 kW.

Example 5

A series of etching tests were performed to determine the effectiveness of lower thermally conductive medium 250 and upper thermally conductive medium 260 in the FIG. 2A embodiment in achieving a uniform etching rate across the diameter of a 300 mm silicon wafer.

Tests were performed in an EXELAN® FLEX™ etching system, manufactured by Lam Research Corporation, located in Fremont, Calif. For each test, 300 mm silicon wafers were blanket coated with a layer of organic photoresist. A gas mixture of 25 SCCM $O_2$/35 SCCM $C_4F_8$/500 SCCM Ar was introduced into the etch chamber at a pressure of 45 mTorr. Dual-frequency power was applied to a bottom electrode, in which the total RF power was varied from about 1 kW to about 3 kW. Hot edge ring 238 and RF coupling ring 240 were mechanically clamped at a torque of about 2 in.-lb. to about 5 in.-lb. Materials for lower thermally conductive medium 250 and upper thermally conductive medium 260 included SIL-PAD® gaskets, Q-PAD® 11 gaskets and KAPTON® gaskets. After the etching of the blanket photoresist layer was completed, etching rate (nm/minute) was measured across the diameter of the wafer.

Figure 9A:
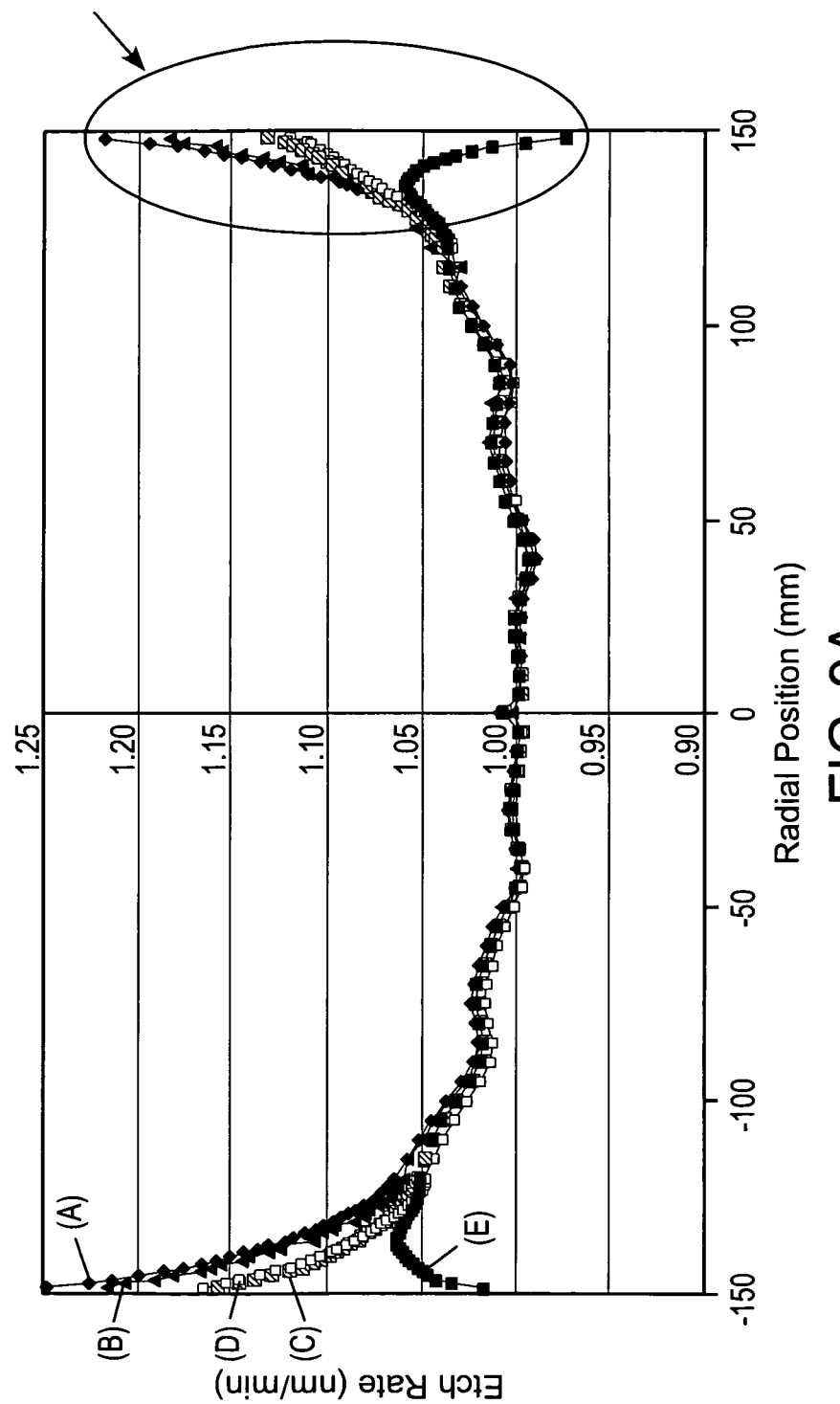
Figure 9B:
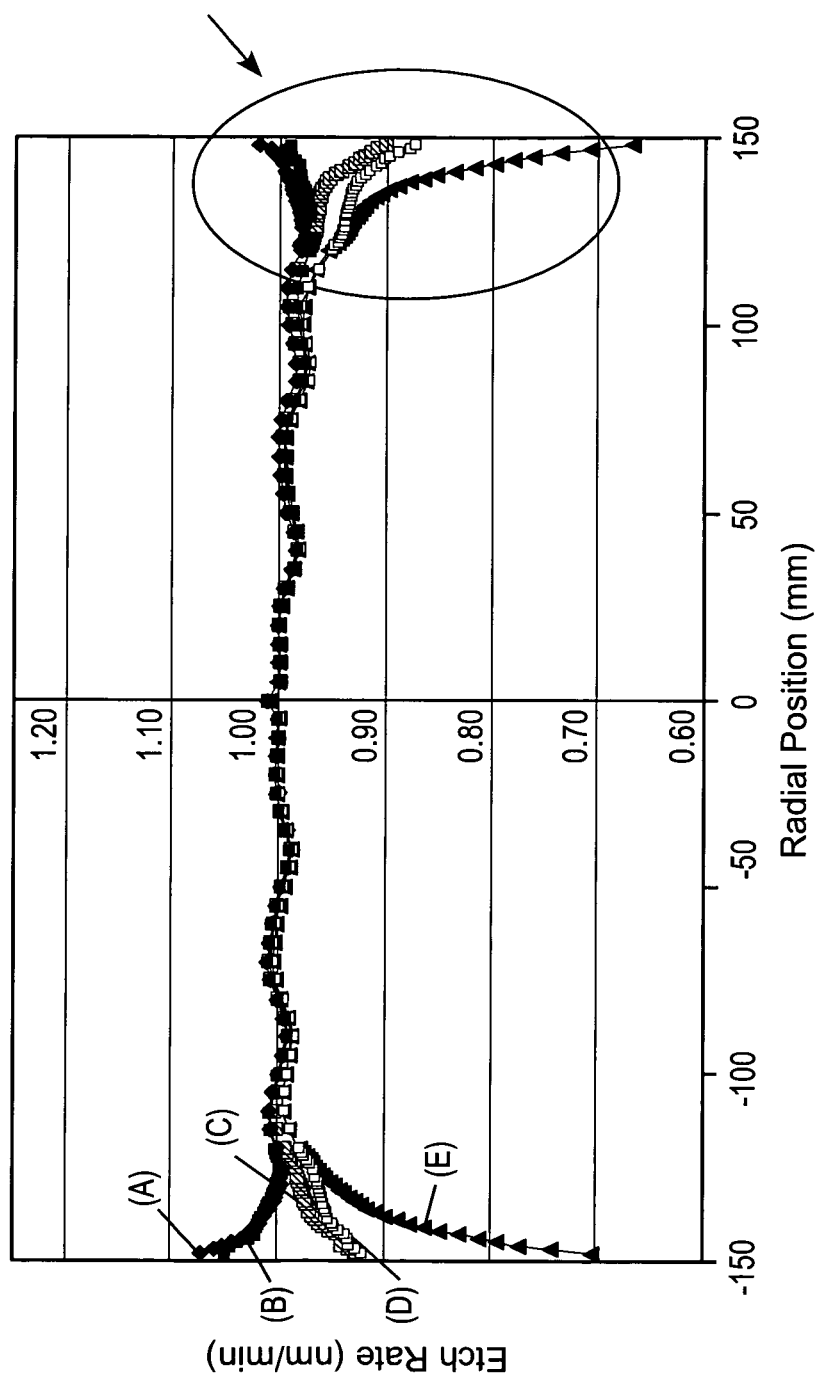

FIGS. 9A-9C illustrate photoresist etching rate profiles as a function of radial position for a total RF power of about 1 kW, about 2 kW and about 3 kW, respectively. From FIGS. 9A-9C, five thermally conductive media were tested: (A) Q-PAD® lower and upper gaskets with a 2 in.-lb. torque; (B) Q-PAD® lower and upper gaskets with a 5 in.-lb. torque; (C) two SIL-PAD® lower gaskets; KAPTON® upper gasket with a 5 in.-lb. torque; (D) no lower thermally conductive medium; two SIL-PAD® upper gaskets; and (E) no lower or upper thermally conductive media.

As indicated in FIGS. 9A-9C (circled region indicted by arrow) the presence of lower thermally conductive medium 250 and/or upper thermally conductive medium 260 (curves A-D) influences etching rate of the photoresist near the edge of the wafer (i.e., at a radial position near ±150 mm). From FIGS. 9A-9C, it has been determined that Q-PAD® lower and upper gasket with a 2 in.-lb. torque and a 5 in.-lb. torque at a total RF power of 2 kW and 3 kW produced the most uniform photoresist etching rate.

While the invention has been described in detail with reference to specific embodiments thereof, it will be apparent to those skilled in the art that various changes and modifications can be made, and equivalents employed, without departing from the scope of the appended claims.

What is claimed is:

1. A temperature-controlled hot edge ring assembly adapted to surround a semiconductor substrate supported in a plasma reaction chamber, the assembly comprising:
   a substrate support with an annular support surface surrounding a substrate support surface,
   a radio-frequency (RF) coupling ring overlying the annular support surface;
   a lower gasket between the annular support surface and the RF coupling ring, the lower gasket being thermally and electrically conductive;
   a hot edge ring overlying the RF coupling ring, wherein the substrate support is adapted to support a substrate such that an outer edge of the substrate overhangs the hot edge ring; and
   an upper thermally conductive medium between the hot edge ring and the RF coupling ring; wherein the thermally conductive medium comprises:
   an inner O-ring and an outer O-ring, the inner O-ring and the outer O-ring being concentrically arranged, wherein the inner O-ring, outer O-ring, the hot edge ring and the RF coupling ring define a volume, the volume adapted to contain pressurized heat transfer gas, wherein the heat transfer gas includes helium, neon, argon or nitrogen.

2. The assembly of claim 1, wherein the inner O-ring and outer O-ring surround an annular channel formed in the RF coupling ring, the inner O-ring, the outer O-ring and the annular channel being concentrically arranged.

3. The assembly of claim 1, further comprising:
   a controller;
   a temperature sensor adapted to measure a temperature of the hot edge ring during plasma processing and supply input signals to the controller;
   a heat transfer gas source and a vacuum pump connected to the volume, the gas source operable to increase a static gas pressure in the volume in response to the controller and the vacuum pump operable to evacuate the volume in response to the controller.

4. The assembly of claim 1, wherein the substrate support is actively cooled with a chilled liquid.

5. The assembly of claim 1, wherein the RF coupling ring is mechanically clamped to the annular support surface; and the hot edge ring is mechanically clamped to the RF coupling ring.

6. The assembly of claim 5, wherein the RF coupling ring is bolted to the annular support surface; and further comprising a clamping ring having a radially extending flange and the hot edge ring having a peripheral recess configured to mate with the flange and secure the hot edge ring to the RF coupling ring, the clamping ring being bolted to the RF coupling ring.

7. The assembly of claim 6, further comprising a polyimide ring between the clamping ring and the hot edge ring.

8. The assembly of claim 7, wherein the RF coupling ring is composed of aluminum oxide, silicon, silicon carbide, or aluminum nitride; the hot edge ring is composed of silicon, silicon carbide or quartz; and the clamping ring is composed of a ceramic material.

9. A method of controlling a temperature of the hot edge ring assembly of claim 3 during plasma processing of a substrate in a plasma processing chamber, the method comprising:
- supporting the substrate on the substrate support;
- introducing a process gas into the plasma processing chamber;
- energizing the process gas into the plasma state;
- measuring a temperature of the hot edge ring;
- decreasing a pressure of the heat transfer gas to the volume if the temperature of the hot edge ring is below a target temperature; or increasing the pressure of the heat transfer gas to the volume if the temperature of the hot edge ring is above a target temperature; and
- processing the substrate with the plasma.

10. The method of claim 9, wherein processing the substrate with the plasma includes: (a) plasma etching a layer of semiconductor material, metal or dielectric material; or (b) deposition of conductive or dielectric material.

11. A plasma processing apparatus comprising the assembly of claim 1, wherein the plasma reaction chamber is a plasma etcher adapted to etch semiconductor, metal or dielectric material; or a deposition chamber adapted to deposit conductive or dielectric material.

12. A temperature-controlled hot edge ring assembly adapted to surround a semiconductor substrate supported in a plasma reaction chamber, the assembly comprising:
- a substrate support with an annular support surface surrounding a substrate support surface;
- a radio-frequency (RF) coupling ring on the annular support surface, wherein the RF coupling ring is mechanically clamped to the annular support surface;
- a thermally insulative medium between the annular support surface and the RF coupling ring;
- a hot edge ring overlying the RF coupling ring, wherein the hot edge ring is mechanically clamped to the RF coupling ring; and
- a thermally conductive medium between the hot edge ring and the RF coupling ring; wherein the thermally insulative medium comprises:
- a first inner O-ring and a first outer O-ring, the first inner O-ring and the first outer O-ring being concentrically arranged, wherein the first inner O-ring, first outer O-ring, the RF coupling ring and the annular support surface define a first volume, the first volume adapted to contain gas at a reduced pressure.

13. The assembly of claim 12, wherein the thermally conductive medium comprises:
- a second inner O-ring and a second outer O-ring, the second inner O-ring and the second outer O-ring being concentrically arranged, wherein the second inner O-ring, second outer O-ring, the hot edge ring and the RF coupling ring define a second volume, the second volume adapted to contain pressurized heat transfer gas; or
- an upper gasket, the upper gasket being thermally and electrically conductive.

14. The assembly of claim 13, further comprising:
- a controller;
- a temperature sensor adapted to measure a temperature of the hot edge ring during plasma processing and supply input signals to the controller;
- a heat transfer gas source and a vacuum pump connected to the first volume and second volume, the gas source operable to increase a static gas pressure in the first volume and the second volume in response to the controller and the vacuum pump operable to evacuate the first volume and the second volume in response to the controller;
- a heating element embedded in the RF coupling ring; and
- a power supply adapted to supply power to the heating element in response to the controller.

15. A method of controlling a temperature of the hot edge ring assembly of claim 14 during plasma processing of a substrate in a plasma processing chamber, the method comprising:
- supporting the substrate on the substrate support;
- introducing a process gas into the plasma processing chamber;
- measuring a temperature of the hot edge ring;
- applying power to the heating element to increase the temperature of the hot edge ring if the temperature of the hot edge ring is below a target temperature; or terminating power to the heating element and increasing a pressure of a heat transfer gas in the first volume if the temperature of the hot edge ring is above the target temperature;
- energizing the process gas into the plasma state; and
- processing the substrate with the plasma.

16. A temperature-controlled hot edge ring assembly adapted to surround a semiconductor substrate supported in a plasma reaction chamber, the assembly comprising:
- a substrate support with an annular support surface surrounding a substrate support surface,
- a radio-frequency (RF) coupling ring on the annular support surface;
- a lower thermally conductive medium between the annular support surface and the RF coupling ring, wherein the RF coupling ring is mechanically clamped to the annular support surface;
- a hot edge ring overlying the RF coupling ring, wherein the substrate support is adapted to support a substrate such that an outer edge of the substrate overhangs the hot edge ring; and
- an upper thermally conductive medium between the hot edge ring and the RF coupling ring, wherein the hot edge ring is mechanically clamped to the RF coupling ring; wherein at least one of the lower or upper thermally conductive medium comprises:
- an inner O-ring and an outer O-ring, the inner O-ring and the outer O-ring being concentrically arranged, wherein the inner O-ring, outer O-ring, at least one of: 1) the hot edge ring and the RF coupling ring; and 2) the annular support surface and the RF coupling ring define a volume, the volume adapted to contain pressurized heat transfer gas, wherein the heat transfer gas includes helium, neon, argon or nitrogen.

* * * * *